United States Patent [19]

Asplund

[11] 4,237,509
[45] Dec. 2, 1980

[54] THYRISTOR CONNECTION WITH OVERVOLTAGE PROTECTION

[75] Inventor: Gunnar Asplund, Ludvika, Sweden

[73] Assignee: ASEA Aktiebolag, Vesteras, Sweden

[21] Appl. No.: 906,509

[22] Filed: May 16, 1978

[30] Foreign Application Priority Data

May 17, 1977 [SE] Sweden ............................. 7705762

[51] Int. Cl.³ ............................................. H02H 3/20
[52] U.S. Cl. ................................ 361/56; 307/252 R; 361/91; 363/54; 363/57
[58] Field of Search .................. 361/56, 91, 110, 111; 363/54, 57, 58, 64, 75, 82, 90, 93, 68, 50, 51, 52, 53, 56; 307/252 R, 252 B, 252 J, 252 K, 252 L, 252 M; 323/22 SC, 23, 24, 25

[56] References Cited

U.S. PATENT DOCUMENTS

| | | | |
|---|---|---|---|
| 3,067,375 | 12/1962 | Jensen | 361/56 X |
| 3,412,312 | 11/1968 | Rice | 307/252 L |
| 3,444,398 | 5/1969 | Brockway | 307/252 L |
| 3,599,075 | 8/1971 | Etter et al. | 363/57 |
| 3,794,908 | 2/1974 | Lindblom et al. | 363/68 |
| 3,865,438 | 2/1975 | Boksjo et al. | 363/54 |
| 3,878,451 | 4/1975 | Ostlund et al. | 307/252 L |
| 4,059,792 | 11/1977 | Etter et al. | 363/54 X |

*Primary Examiner*—Patrick R. Salce
*Attorney, Agent, or Firm*—Pollock, Vande Sande & Priddy

[57] ABSTRACT

A thyristor overvoltage protection circuit wherein an avalanche diode conducts to divert overvoltage energy from a thyristor to avoid self-ignition of the thyristor when the overvoltage reaches a particular level. A simulator circuit monitors the thermal loading on the conducting diode and activates an ignition pulse device if the thermal loading exceeds the safe operational range of the diode. The activated ignition pulse device ignites the thyristor so that the thyristor may divert the overvoltage energy and thereby discharge the diode.

5 Claims, 3 Drawing Figures

4,237,509

THYRISTOR CONNECTION WITH OVERVOLTAGE PROTECTION

BACKGROUND OF THE INVENTION

The invention relates to overvoltage protection for a thyristor and, more particularly, to an improved overvoltage protection circuit including an avalanche diode for diverting a specified amount of overvoltage energy from a thyristor and a cooperating simulator circuit and ignition pulse device adapted to ignite the thyristor to divert overvoltage energy and discharge the avalanche diode when the load on the diode exceeds a specified safe operational amount.

Thyristors are used in electrical valves, for example for high-voltage convertors, wherein many thyristors may be connected in series and overvoltages may occur across all of the series connected thyristors or across individual thyristors in the chain, due to an uneven voltage distribution over the thyristors. Such overvoltages may permanently damage the thyristors by inducing self-ignition.

It is known in the art to divert overvoltage energy from a thyristor to prevent the damaging overvoltage-induced self-ignition by using a diverter circuit connected in parallel with the thyristor to divert the entire overvoltage energy away from the thyristor. However, the components of such diverters must necessarily be dimensioned to operate under high energy conditions.

Since a properly ignited thyristor is usually able to pass the overvoltage energy without damage, it has been suggested that high energy diverters may be avoided by using a diverter circuit with components of relatively small dimensions to detect the overvoltage condition and to thereafter activate an ignition pulse device to ignite the thyristor to pass the overvoltage energy.

However, a disadvantage of this overvoltage protection scheme is that the thyristor must be quickly ignited after the initial sensing of an overvoltage condition and therefore, the thyristor is often needlessly ignited in response to low energy overvoltages and unnecessary disturbances are thereby induced in the thyristor circuit.

Accordingly, it is an object of the invention to provide a simple and effective means to protect a thyristor from overvoltage-induced self-ignition without needlessly igniting the thyristor in response to low energy overvoltages.

A further object of the invention is to provide a thyristor overvoltage protection means wherein the discharge capacity of the diverter is fully utilized.

Another object of the invention is to provide a thyristor overvoltage protection means that compensates for the non-ideal electrical characteristics of an avalanche diode diverter.

A further object of the invention is to provide an overvoltage protection means that will operate to protect reversible thyristor valves against overvoltages.

These and other objects of the invention will become apparent from a review of the detailed specification which follows and a consideration of the accompanying drawings.

BRIEF SUMMARY OF THE INVENTION

In order to achieve the objects of the invention and to overcome the problems of the prior art, the thyristor overvoltage protection circuit, according to the invention, includes an avalanche diode that is adapted to conduct to divert overvoltage energy from a thyristor and to thereby avoid self-ignition of the thyristor when the overvoltage reaches a particular level.

A simulator circuit is adapted to monitor the thermal loading on the conducting diode and to activate an ignition pulse device if the thermal loading begins to exceed the safe operational range of the diode.

The activated ignition pulse device then ignites the thyristor so that the thyristor may conduct to divert the overvoltage energy and thereby discharge the diode.

The energy diverting operation of the diode within its thermal loading operational range avoids the unnecessary ignition of the thyristor in response to small overvoltages and the thyristor is only ignited to pass a large overvoltage when there is a risk of overloading the diode. Very large overvoltages will cause the similator to immediately activate the pulse device to ingite the thyristor.

A reactor and a particular blocking diode may be included in the overvoltage protection circuit to compensate for the non-ideal voltage response characteristic of the avalanche diode.

In addition, opposed thyristors, for example as used for reversible convertors, may be protected against overvoltages by the cooperation of a symmetrical diode and opposed simulator circuits and pulse devices.

The ignition pulse device of the invention may include a normal thyristor pulse device with a special input with a level discriminator or a separate pulse device responsive to the simulator circuit and connected in parallel with the normal thyristor pulse device.

DETAILED DESCRIPTION OF PREFERRED EMBODIMENTS

Figure 1:
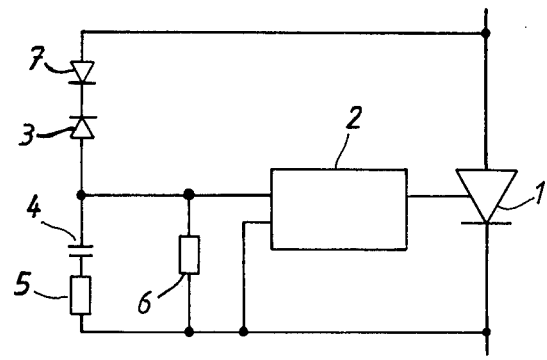
FIG. 1 shows a diagram of a thyristor overvoltage protection circuit in accordance with an embodiment of the invention.

The remaining portion of this specification will describe preferred embodiments of the invention when read in conjunction with the attached drawings, in which like reference characters identify identical apparatus.

FIG. 1 shows a thyristor 1 with an associated ignition pulse device 2 connected in parallel with an overvoltage protection circuit including an avalanche or zener diode 3 and a series connected simulator circuit. The simulator circuit includes a capacitor 4, series connected resistor 5, and parallel connected resistor 6. A blocking diode 7 is connected in series with the avalanche diode 3 to block the reverse voltage of the thyristor 1.

In operation, when an overvoltage of a particular magnitude and polarity is applied to the thyristor 1, the avalanche diode 3 begins to conduct to divert the overvoltage energy from the thyristor and to thereby avoid a damaging self-ignition of the thyristor. As the diode 3 conducts overvoltage energy, it stores some of the applied energy as heat and radiates the stored heat at a characteristic rate. Thus, the passage of current through the diode 3 defines a corresponding thermal load on the diode.

It will be apparent to those skilled in the art that if the thermal load on the diode 3 exceeds a particular operational amount, the diode will be damaged due to the effects of excessive heat energy. Therefore, in accordance with the operation of the invention, the components of the simulator circuit 4–6 operate in a manner known to the art, for example as disclosed in U.S. Pat. No. 3,865,438 to C. Boksjo, et al., "Protection Means Against Auto-Ignition for the Rectifiers of a Static Converter", to electrically simulate the thermal loading or energy stored in the conducting diode 3.

More particularly, the current through the capacitor 4 and the resistor 5 corresponds to the thermal energy developed in the avalanche diode 3, and the discharge current through the resistor 6 corresponds to the energy that is radiated by the diode 3.

Thus, the simulator circuit 4–6 will generate a voltage signal that is proportional to the thermal loading on the avalanche diode 3. If the overvoltage is either momentary or otherwise of low energy, the capacitor 4 will absorb the energy passed by the conducting avalanche diode 3 and the energy will be discharged across the resistor 6. This operation of the simulator circuit will reflect the fact that the thermal loading on the avalanche diode has not reached a destructive level and, therefore, the simulator circuit will not trigger the ignition pulse device 2.

However, if an overvoltage of higher energy or longer duration is applied to the thyristor and the applied energy exceeds the specified safe operational range for the diode 3, the simulator circuit 4–6 will generate a voltage of sufficient magnitude to trigger the ignition pulse device 2. The pulse device 2 will then ignite the thyristor 1 to cause the thyristor to conduct to divert the excessive overvoltage energy and to thereby safely discharge the diode 3.

It should be appreciated that the above operation of the circuit of the invention will result in a utilization of the full discharge capacity of the avalanche diode since the simulator components 4–6 are dimensioned to closely approximate the thermal loading of the avalanche diode 3 and, therefore, the diode 3 will divert its rated maximum safe amount of energy before the thyristor 1 is ignited. Therefore, premature or unnecessary operation of the thyristor will be avoided.

In addition, it should be understood that the pulse device 2 may include a normal thyristor ignition control device, for example as disclosed in U.S. Pat. No. 3,794,908, "Thyristor Rectifier for High Voltage", provided with a special input with a level discriminator, or the pulse device 2 may include a separate pulse device responsive to the simulator circuit and connected in parallel with the normal ignition control device.

Moreover, it is noted that although in normal operation the simulator circuit simulates the stored energy of the diode to activate the pulse device 2 in response to excessive applied overvoltage energy, an unusually large overvoltage will result in a high diode discharge current that will cause the simulator circuit to immediately respond to activate the pulse device 2.

Figure 2:
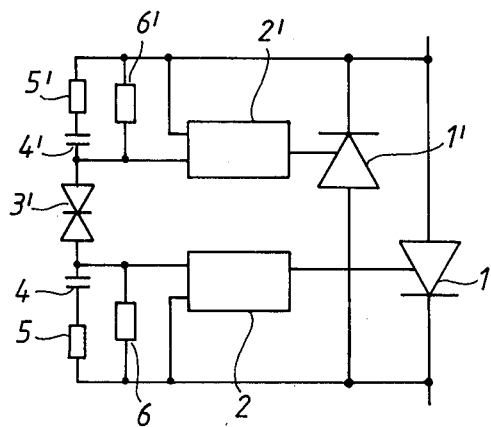
FIG. 2 shows a diagram of an overvoltage protection circuit for a reversible thyristor valve.

FIG. 2 shows a circuit of the invention wherein opposed thyristors 1 and 1' are respectively protected against overvoltages in the above-described manner by the co-operation of a symmetrical avalanche diode 3', simulator circuits 4–6 and 4'–6', and pulse devices 2 and 2'. The apparatus of FIG. 2 is typically used for reversible convertors or as a controllable connection with alternating current.

The overvoltage protection circuits of FIGS. 1 and 2 has the disadvantage that the avalanche diode 3 does not have an ideal "knee bend" characteristic. Therefore, the voltage across the avalanche diode 3 and the thyristor 1 may rise to a dangerously high overvoltage level before the pulse device 2 is triggered by the simulator circuit.

Figure 3:
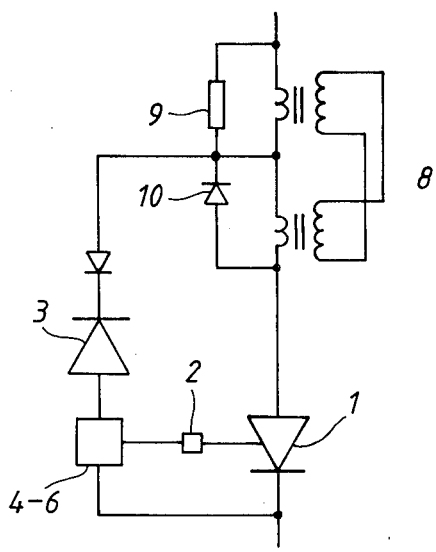
FIG. 3 shows a diagram of a thyristor overvoltage protection circuit that compensates for the non-ideal characteristics of an avalanche diode diverter.

The circuit of FIG. 3 may be used to compensate for the non-ideal characteristic of the diode 3. In the circuit, the thyristor 1 is connected in series with a compensating reactor 8 and the avalanche diode is connected at the midpoint between the reactor 8 and the thyristor 1. A resistor 9 is connected in parallel with the upper winding of the reactor 8, and the resistance of the resistor 9 is equal to the resistance of the avalanche diode 3, so that the diode 3 is compensated across the reactor. A blocking diode 10 compensates for the non-resistive impedance of the avalanche diode 3.

It should be appreciated that the reactor 8 may be designed with interconnected secondary windings as shown or with just primary windings and a common core. However, the connection illustrated in FIG. 3 has the advantage that it may be designed with ring-cores that need only be fitted on the thyristor lead.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. In an overvoltage protection circuit for a thyristor having an impedance means connected in parallel with the thyristor, the impedance of the impedance means decreasing from a first high value to a lower value in accordance with an impedance characteristic and in response to an increase in the voltage across the impedance means exceeding a predetermined value, the improvement of a circuit means for compensating for the non-ideal impedance characteristic of the impedance means comprising:

inductive means having a first winding connected in series with the thyristor only, and a second winding connected in series with the parallel connection of the thyristor and said impedance means, resistive means connected in parallel with said second winding for generating a voltage across the second winding when the impedance means is conducting with a low impedance, said second winding being coupled to said first winding for generating a voltage in said first winding compensating for the resistive voltage drop in the impedance means.

2. The circuit of claim 1 wherein said first and second windings have a common magnetic core for inductively coupling the windings.

3. The circuit of claim 1 including a first core for said first winding and an associated third winding, and a second core for said second winding and an associated fourth winding, said third and fourth windings being connected to each other.

4. The circuit of claim 1 wherein the resistance of said resistive means corresponds to the resistance of said impedance means, when the impedance means is conducting with a low impedance.

5. The circuit of claim 1 wherein said impedance means is an avalanche diode.

* * * * *